(12) United States Patent
Li et al.

(10) Patent No.: US 12,300,705 B2
(45) Date of Patent: May 13, 2025

(54) DISPLAY PANEL AND MANUFACTURING METHOD THEREOF, AND ELECTRONIC TERMINAL

(71) Applicant: Shenzhen China Star Optoelectronics Semiconductor Display Technology Co., Ltd., Guangdong (CN)

(72) Inventors: Zhuhui Li, Guangdong (CN); Yanfen Li, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 471 days.

(21) Appl. No.: 17/796,657

(22) PCT Filed: Jul. 13, 2022

(86) PCT No.: PCT/CN2022/105514
§ 371 (c)(1),
(2) Date: Jul. 31, 2022

(87) PCT Pub. No.: WO2024/000661
PCT Pub. Date: Jan. 4, 2024

(65) Prior Publication Data
US 2024/0021628 A1 Jan. 18, 2024

(51) Int. Cl.
*H01L 27/12* (2006.01)
*H01L 23/00* (2006.01)
(Continued)

(52) U.S. Cl.
CPC .......... *H01L 27/1248* (2013.01); *H01L 24/05* (2013.01); *H01L 25/167* (2013.01);
(Continued)

(58) Field of Classification Search
CPC ... H01L 27/1248; H01L 24/05; H01L 25/167; H01L 27/1288; H01L 33/62; H01L 24/08;
(Continued)

(56) References Cited

U.S. PATENT DOCUMENTS

2014/0232624 A1 8/2014 Kim et al.
2016/0300866 A1* 10/2016 Long ................. H01L 21/26513
(Continued)

FOREIGN PATENT DOCUMENTS

| CN | 102347013 A | 2/2012 |
|---|---|---|
| CN | 105845066 A | 8/2016 |

(Continued)

OTHER PUBLICATIONS

International Search Report in International application No. PCT/CN2022/102580, mailed on Dec. 27, 2022.
(Continued)

*Primary Examiner* — Douglas W Owens
(74) *Attorney, Agent, or Firm* — Rivka Friedman (57) ABSTRACT

A display panel and a manufacturing method thereof, and an electronic terminal are provided and including a driving circuit layer, a planarization layer, an electrode layer, and a light-emitting layer which are stacked from bottom to top. The driving circuit layer includes driving circuits. The planarization layer includes first planarization portions and second planarization portions which are arranged in a same layer. The electrode layer includes electrode groups. The light-emitting layer includes light-emitting devices. The first planarization portion is disposed on a side of the driving circuit close to the electrode layer, and the second planarization portion is disposed on a side of one of the electrode group close to the driving circuit layer. A thickness of the second planarization portion is greater than a thickness of the first planarization portion.

20 Claims, 4 Drawing Sheets

(51) Int. Cl.
*H01L 25/16* (2023.01)
*H01L 33/62* (2010.01)

(52) U.S. Cl.
CPC .......... *H01L 27/1288* (2013.01); *H01L 33/62* (2013.01); *H01L 24/08* (2013.01); *H01L 2224/05027* (2013.01); *H01L 2224/05073* (2013.01); *H01L 2224/05124* (2013.01); *H01L 2224/05147* (2013.01); *H01L 2224/05186* (2013.01); *H01L 2224/05558* (2013.01); *H01L 2224/05561* (2013.01); *H01L 2224/05573* (2013.01); *H01L 2224/05686* (2013.01); *H01L 2224/08148* (2013.01); *H01L 2924/0549* (2013.01); *H01L 2924/12041* (2013.01)

(58) Field of Classification Search
CPC . H01L 2224/05027; H01L 2224/05073; H01L 2224/05186; H01L 2224/05558; H01L 2224/05561; H01L 2224/05573; H01L 2224/05686; H01L 2224/08148; H01L 2924/0549; H01L 2924/12041; H01L 29/78633; H01L 2933/0025; H01L 2933/0066; H01L 25/0753; H01L 33/44; H01L 27/153
See application file for complete search history.

(56) References Cited

U.S. PATENT DOCUMENTS

| 2017/0194363 | A1* | 7/2017 | Ma | H01L 27/127 |
| 2021/0151472 | A1* | 5/2021 | Kang | H01L 33/08 |
| 2023/0105289 | A1* | 4/2023 | Choi | H01L 27/1225 |
| | | | | 257/40 |
| 2024/0258289 | A1* | 8/2024 | Zhu | H01L 33/58 |

FOREIGN PATENT DOCUMENTS

| CN | 112530344 A | 3/2021 |
| CN | 112540486 A | 3/2021 |
| CN | 112907457 A | 6/2021 |
| CN | 113741107 A | 12/2021 |

OTHER PUBLICATIONS

Written Opinion of the International Search Authority in International application No. PCT/CN2022/102580, mailed on Dec. 27, 2022.

* cited by examiner

DISPLAY PANEL AND MANUFACTURING METHOD THEREOF, AND ELECTRONIC TERMINAL

FIELD OF DISCLOSURE

The present disclosure relates to the field of display technologies, in particular to a manufacture of display devices, in particular to a display panel and a manufacturing method thereof, and an electronic terminal.

BACKGROUND

Micro light-emitting diodes (micro-LEDs) have cross-generational advantages in brightness, resolution, energy consumption, lifespan, response speed, and thermal stability, and are an internationally recognized future display technology.

However, at present, a substrate used to carry the micro-LED is limited by a manufacturing process, resulting in a low position on the substrate for bonding the micro-LED, and a height of the micro-LED itself is also low. Therefore, in a process of transferring a plurality of micro-LEDs on a transfer stage to the substrate, at least some of the micro-LEDs cannot be stably bonded to corresponding multiple parts on the substrate, so that the lights are dimmed or even dropped. As a result, a display panel formed by the micro-LEDs has many dark spots, which reduces a quality of display images.

Therefore, the existing display panels formed by micro-LEDs have the problem that the bonding of micro-LEDs is not stable, resulting in low quality of display images, and needs to be improved.

SUMMARY OF DISCLOSURE

A purpose of the present disclosure is to provide a display panel and a manufacturing method thereof, and an electronic terminal, so as to solve a technical problem of low quality of display images caused by unstable bonding of micro-LEDs in existing display panels formed by micro-LEDs.

The present disclosure provides a display panel and a manufacturing method thereof, and an electronic terminal, including:
  a driving circuit layer including a plurality of driving circuits;
  an electrode layer disposed on the driving circuit layer and including a plurality of electrode groups which are in one-to-one correspondence with the plurality of driving circuits, where the electrode groups are correspondingly electrically connected to the driving circuits;
  a planarization layer disposed between the driving circuit layer and the electrode layer, and including a plurality of first planarization portions and a plurality of second planarization portions which are arranged on a same layer, where the plurality of first planarization portions are in one-to-one correspondence with the plurality of driving circuits, the plurality of second planarization portions are in one-to-one correspondence with the plurality of electrode groups, each of the first planarization portions is disposed on a corresponding side of one of the driving circuits close to the electrode layer, and each of the second planarization portions is disposed on a corresponding side of one of the electrode groups close to the driving circuit layer; and
  a light-emitting layer disposed on a side of the electrode layer away from the driving circuit layer, and including a plurality of light-emitting devices which are in one-to-one correspondence with the plurality of electrode groups, where the light-emitting devices are correspondingly electrically connected to the electrode groups.

A thickness of one of the second planarization portions is greater than a thickness of one of the first planarization portions.

In one embodiment, further includes:
  a black matrix layer disposed on a side of the plurality of first planarization portions away from the driving circuit layer, where a difference between a distance between a top of the black matrix layer and the substrate and a distance between a top of the electrode layer and the substrate is less than or equal to a thickness of one of the light-emitting devices.

In one embodiment, the difference between the distance between the top of the black matrix layer and the substrate and the distance between the top of the electrode layer and the substrate is less than or equal to 0.

In one embodiment, further includes:
  a first passivation layer disposed between the plurality of first planarization portions and the black matrix layer, where an adhesive force between the first passivation layer and the black matrix layer is greater than an adhesive force between the first planarization portions and the black matrix layer.

In one embodiment, the second planarization portions are provided with via holes, and the electrode groups are correspondingly electrically connected to the driving circuits through the via holes.

In one embodiment, each of the electrode groups includes:
  a first sub-electrode portion correspondingly electrically connected to one of the driving circuits through the via hole, where a constituent material of the first sub-electrode portion includes metal; and
  a second sub-electrode portion disposed on a side of the first sub-electrode portion away from the driving circuits, and correspondingly electrically connected between the first sub-electrode portion and the light-emitting device, where a constituent material of the second sub-electrode portion includes metal oxides.

In one embodiment, each of the via holes includes a first via hole and a second via hole which are arranged at intervals, and each of the electrode groups includes:
  a first electrode correspondingly electrically connected to the driving circuit through the first via hole; and
  a second electrode, where the second electrode and the first electrode are arranged on a same layer and spaced apart from each other, and the second electrode is electrically connected to an electrode wiring through the second via hole.

In one embodiment, each of the driving circuits includes:
  a driving transistor, the first electrode is electrically connected to a drain of the driving transistor, and the electrode wiring and the drain of the driving transistor are arranged in a same layer.

In one embodiment, the light-emitting devices are micro light-emitting diodes or mini light-emitting diodes.

The present disclosure provides an electronic terminal including the display panel as described in any one of the above.

The present disclosure provides a manufacturing method of a display panel, including:

provideing a driving circuit layer which includes a plurality of driving circuits;

forming a planarization film on the driving circuit layer, and forming a planarization layer by processing the planarization film using a grayscale photomask, where the planarization layer includes a plurality of first planarization portions and a plurality of second planarization portions which are arranged in a same layer, a thickness of one of the second planarization portions is greater than a thickness of one of the first planarization portions, the planarization layer is provided with via holes, the plurality of first planarization portions are in one-to-one correspondence with the plurality of driving circuits, each of the first planarization portions is disposed on a corresponding side of one of the driving circuits close to the electrode layer;

forming an electrode layer on the planarization layer, where the electrode layer includes a plurality of electrode groups which are in one-to-one correspondence with the plurality of driving circuits, the electrode groups are correspondingly electrically connected to the driving circuits through the via holes, the plurality of second planarization portions are in one-to-one correspondence with the plurality of electrode groups, and each of the second planarization portions is disposed on a corresponding side of one of the electrode groups close to the driving circuit layer; and forming a light-emitting layer on the electrode layer, where the light-emitting layer includes a plurality of light-emitting devices which are in one-to-one correspondence with the plurality of electrode groups, and the light-emitting devices are correspondingly electrically connected to the electrode groups.

In one embodiment, the grayscale photomask includes a first area, a second area, and a third area, and light transmittances of the first area, the second area, and the third area are sequentially decreased.

The step of forming the planarization layer by processing the planarization film using the grayscale photomask includes:

arranging the grayscale photomask relative to the planarization film;

forming the via holes by processing a corresponding portion of the planarization film using the first area of the grayscale photomask, forming the first planarization portions by processing a corresponding portion of the planarization film using the second area of the grayscale photomask, and forming the second planarization portions by processing a corresponding portion of the planarization film using the third area of the grayscale photomask.

The present disclosure provides a display panel and a manufacturing method thereof, and an electronic terminal, including a driving circuit layer, an electrode layer, a planarization layer, and a light-emitting layer. The driving circuit layer includes a plurality of driving circuits. The electrode layer is disposed on the driving circuit layer and includes a plurality of electrode groups which are in one-to-one correspondence with the plurality of driving circuits. The electrode groups are correspondingly electrically connected to the driving circuits. The planarization layer is disposed between the driving circuit layer and the electrode layer, and includes a plurality of first planarization portions and a plurality of second planarization portions which are arranged on a same layer. The plurality of first planarization portions are in one-to-one correspondence with the plurality of driving circuits, the plurality of second planarization portions are in one-to-one correspondence with the plurality of electrode groups, each of the first planarization portions is disposed on a corresponding side of one of the driving circuits close to the electrode layer, and each of the second planarization portions is disposed on a corresponding side of one of the electrode groups close to the driving circuit layer. The light-emitting layer is disposed on a side of the electrode layer away from the driving circuit layer, and includes a plurality of light-emitting devices which are in one-to-one correspondence with the plurality of electrode groups. The light-emitting devices are correspondingly electrically connected to the electrode groups. A thickness of one of the second planarization portions is greater than a thickness of one of the first planarization portions. A difference between a distance between a top of the electrode group and the substrate and a distance between a top of the first planarization portion and the substrate in a vertical direction is reduced, so as to reduce a risk that the top of the first planarization portion is too high and prevent the light-emitting device from contacting the electrode group, thereby improving a reliability of the light-emitting device being fixed to the electrode group, and improving a quality of display images.

BRIEF DESCRIPTION OF DRAWINGS

The present disclosure is further described below with reference to the accompanying drawings. It should be noted that the drawings in the following description are only used to explain some embodiments of the present disclosure. For those skilled in the art, other drawings can also be obtained from these drawings without creative efforts.

DETAILED DESCRIPTION

The following will clearly and completely describe the technical solutions in the embodiments of the present disclosure with reference to the accompanying drawings in the embodiments of the present disclosure. Obviously, the described embodiments are only some, but not all, embodiments of the present disclosure. Based on the examples in the present disclosure. All other embodiments obtained by those skilled in the art without creative efforts fall within the protection scope of the present disclosure.

In the description of the present disclosure, it should be understood that terms such as "on", "near", "away from" or the likes are based on orientations or positional relationship shown in the drawings, for example, "on" indicates a surface located above an object, specifically right above, obliquely upward or on the upper surface of the object as long as it is located above a level of the object. The aforesaid relationship of the position or orientation is only for the purpose of facilitating description of the present invention and simplifying the description, but is not intended to or implied that the device or element referred to must have a specific orientation, and be constructed and operated in a particular orientation. Therefore, it should not be construed as a limitation of the present invention. Furthermore, terms such as "first" and "second" are merely intended for a purpose of description, and shall not be understood as an indication or implication of relative importance or implicit indication of a quantity of indicated technical features. Therefore, there is a limitation that features such as "first" and "second" may explicitly or implicitly include one or more features.

In addition, it should be noted that the accompanying drawings only illustrate structures and steps that are closely related to the present application, and omit some details that are not closely related to the application. The purpose is to simplify the drawings and make the application point clear, and is not to show that the actual device and method are exactly the same as the drawings, and it is not intended to be a limitation of the actual device and method.

The present disclosure provides a display panel including, but not limited to, the following embodiments and combinations of the following embodiments.

Figure 1:
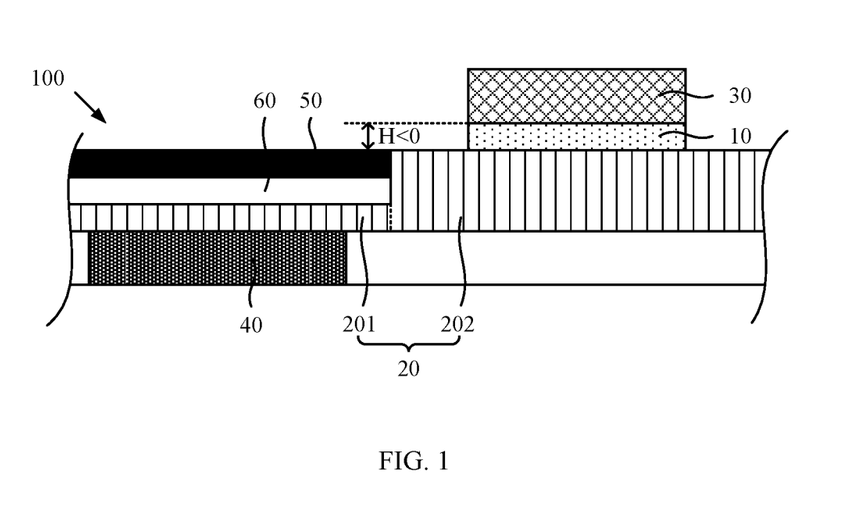
FIG. 1 is a schematic cross-sectional view of a first display panel of an embodiment of the present disclosure.
Figure 2:
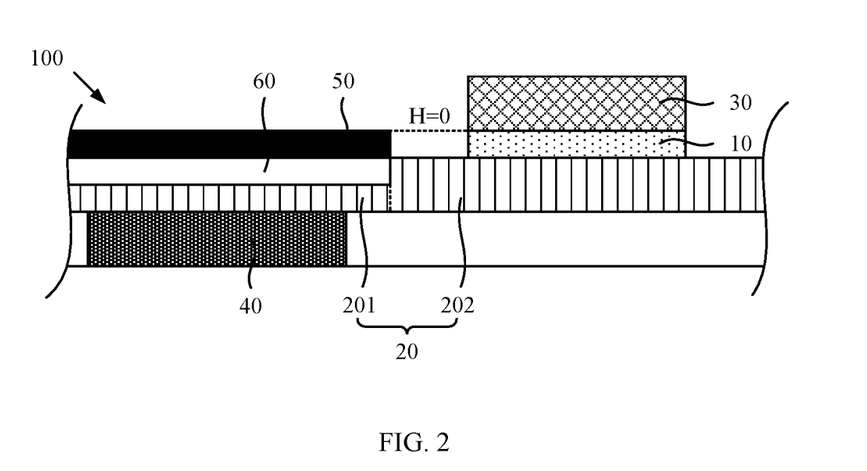
FIG. 2 is a schematic cross-sectional view of a second display panel of an embodiment of the present disclosure.
Figure 3:
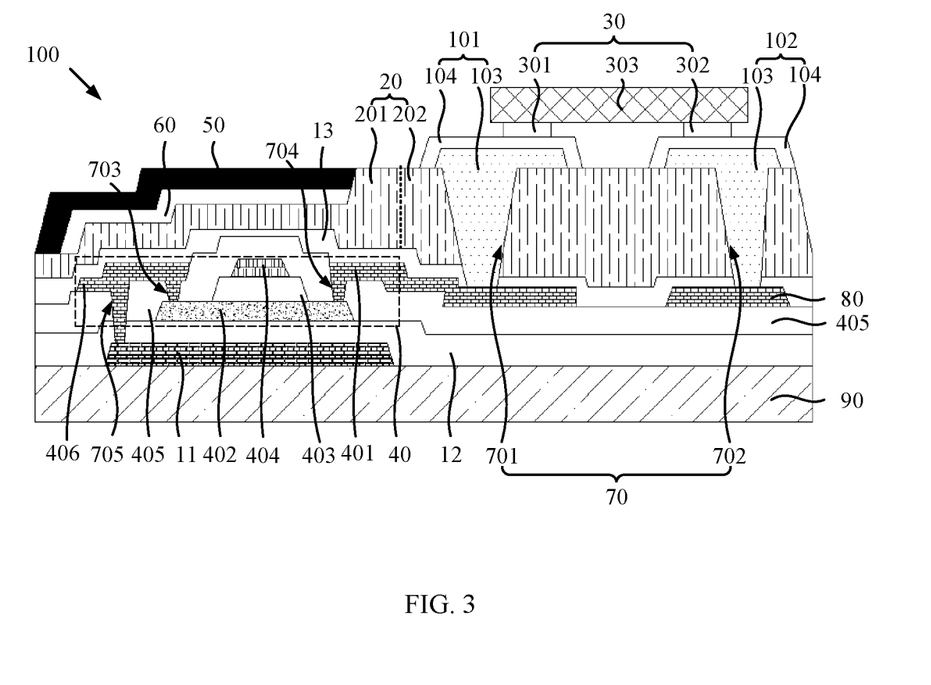
FIG. 3 is a schematic cross-sectional view of a third display panel of an embodiment of the present disclosure.

In one embodiment, as shown in FIG. 1 to FIG. 3, a display panel 100 includes a driving circuit layer, an electrode layer, a planarization layer 20, and a light-emitting layer. The driving circuit layer includes a plurality of driving circuits. The electrode layer is disposed on the driving circuit layer and includes a plurality of electrode groups 10 which are in one-to-one correspondence with the plurality of driving circuits. The electrode groups 10 are correspondingly electrically connected to the driving circuits. The planarization layer 20 is disposed between the driving circuit layer and the electrode layer, and includes a plurality of first planarization portions 201 and a plurality of second planarization portions 202 which are arranged on a same layer. The plurality of first planarization portions 201 are in one-to-one correspondence with the plurality of driving circuits, the plurality of second planarization portions 202 are in one-to-one correspondence with the plurality of electrode groups 10, each of the first planarization portions 201 is disposed on a corresponding side of one of the driving circuits close to the electrode layer, and each of the second planarization portions 202 is disposed on a corresponding side of one of the electrode groups 10 close to the driving circuit layer. The light-emitting layer is disposed on a side of the electrode layer away from the driving circuit layer, and includes a plurality of light-emitting devices 30 which are in one-to-one correspondence with the plurality of electrode groups 10. The light-emitting devices 30 are correspondingly electrically connected to the electrode groups 10. A thickness of one of the second planarization portions 202 is greater than a thickness of one of the first planarization portions 201.

As shown in FIG. 1 to FIG. 3, the plurality of driving circuits may be arranged in an array, but not limited to. The driving circuits may include a plurality of transistors that are electrically connected. The plurality of transistors may include driving transistors 40 electrically connected to corresponding light-emitting devices 30. The driving circuit layer may further include a plurality of gate lines and a plurality of data lines arranged to intersect with the plurality of gate lines. Each of the driving circuits can be electrically connected to the corresponding gate line and the corresponding data line so that the corresponding driving transistor 40 drives the corresponding light-emitting device 30 to emit light. It should be noted that, in the driving circuit layer, the driving circuits may include a plurality of metal layers and an insulating layer. The metal layers are stacked and spaced apart from each other. The insulating layer is provided between two adjacent metal layers. Thus, the driving circuits have a larger thickness than other areas in the driving circuit layer, causing a top of the driving circuit to be higher than tops of other areas in the driving circuit layer. For example, it can be considered here that a top of the driving transistor 40 is higher than the tops of other areas in the driving circuit layer. Also, the electrode groups 10 can be arranged opposite to gaps between two adjacent driving circuits. If a thickness of the planarization layer 20 is the same everywhere, the top of the driving circuit layer will be higher than the top of the electrode groups 10 in a vertical direction, and there is a large distance between the two, which is not conducive to fixing the light-emitting devices 30 on the electrode groups 10.

It can be understood that, in the planarization layer 20 of the embodiment, the plurality of first planarization portions 201 are in one-to-one correspondence with the plurality of driving circuits and are respectively disposed opposite to each other. The plurality of second planarization portions 202 are in one-to-one correspondence with the plurality of electrode groups 10 and are respectively disposed opposite to each other. A thickness of the plurality of first planarization portions 201 is set to be smaller than a thickness of the plurality of second planarization portions 202. That is, the second planarization portions 202 having a larger thickness and the first planarization portions 201 having a smaller thickness can reduce the distance between the tops of the electrode groups 10 and the tops of the first planarization portions 201 in the vertical direction. It is beneficial to realize that the tops of the electrode groups 10 and the tops of the first planarization portions 201 tend to be consistent, even the tops of the electrode groups 10 are higher than the tops of the first planarization portions 201. A risk that the tops of the first planarization portions 201 are too high to block the light-emitting devices 30 from contacting the electrode groups 10 can be reduced. A difficulty of fixing light-emitting devices 30 to electrode groups 10 is reduced, a reliability of light-emitting devices 30 being fixed to electrode groups 10 is improved, and a quality of display images is improved.

In one embodiment, as shown in FIG. 1 to FIG. 3, the display panel 100 further includes a black matrix layer 50 disposed on a side of the plurality of first planarization portions 201 away from the driving circuit layer. A difference H between a distance between a top of the black matrix layer 50 and the substrate and a distance between a top of the electrode layer and the substrate is less than or equal to a thickness of the light-emitting device 30. Specifically, the black matrix layer may cover a side of the plurality of first planarization portions 201 away from the driving circuit layer. That is, it can be considered that the plurality of second planarization portions 202 are arranged surrounded by the black matrix layer 50, or it can be considered that the black matrix layer 50 is arranged to surround the plurality of light-emitting devices 30. The black matrix layer can absorb light from a side of the light-emitting devices 30 to reduce a risk of color mixing, and can also absorb external light to reduce reflectivity. A constituent material of the black matrix layer 50 may include, but are not limited to, chromium, carbon black, and black resin.

It should be noted that, in combination with the above discussion, the top of the black matrix layer 50 is higher than the top of the electrode layer, that is, the above-mentioned difference H is greater than 0. The black matrix layer 50 is arranged around the plurality of second planarization portions 202 for carrying the plurality of light-emitting devices 30. If the difference H mentioned above is too large, the top of the black matrix layer 50 will also be too high to prevent the light-emitting devices 30 from contacting the electrode groups 10. It can be understood that the difference H mentioned above in this embodiment can be changed by, but not limited to, adjusting a thickness ratio of the second planarization portion 202 and the first planarization portion 201 and the thickness of the electrode group 10. The difference H mentioned above in this embodiment is set to be less than or equal to the thickness of the light-emitting device 30, that is, the thickness of the light-emitting device 30 is sufficiently larger than the difference H mentioned above. In the process of transferring the light-emitting devices 30 to the corresponding second planarization portions 202, the thickness of the light-emitting devices 30 is large enough so that the light-emitting devices 30 can overcome the above-mentioned difference H to contact the electrode layer, thereby improving the reliability of the light-emitting devices 30 being fixed to the electrode groups 10 and improving the quality of the display image.

In one embodiment, as shown in FIG. 1 to FIG. 3, the difference H between the distance between the top of the black matrix layer 50 and the substrate and the distance between the top of the electrode layer and the substrate is less than or equal to 0. In FIG. 1 and FIG. 3, the top of the black matrix layer 50 is lower than the top of the electrode layer, that is, the difference H mentioned above is less than 0. In FIG. 2, the top of the black matrix layer 50 is flush with the top of the electrode layer, that is, the difference H mentioned above is equal to 0. Specifically, in combination with the above discussion, the top of the electrode layer in this embodiment is higher than or flush with the top of the black matrix layer 50. That is, the black matrix layer 50 will not protrude from the plurality of electrode groups 10 to hinder the fixing of the light-emitting devices 30 and the electrode groups 10. Therefore, in this embodiment, compared to the top of the black matrix layer being higher than the top of the electrode layer, in the process of transferring the light-emitting devices 30 to the corresponding second planarization portions 202, the light-emitting devices 30 can be prevented from reaching the electrode groups 10 by sinking below the top of the black matrix layer 50, but can reach the electrode groups 10 when they are flush with or even higher than the top of the black matrix layer 50, thereby improving the reliability of the light-emitting devices 30 being fixed to the electrode groups 10, and improving the quality of the display images.

In one embodiment, as shown in FIG. 1 to FIG. 3, the display panel 100 further includes a first passivation layer 60 disposed between the plurality of first planarization portions 201 and the black matrix layer 50. An adhesive force between the first passivation layer 60 and the black matrix layer 50 is greater than an adhesive force between the first planarization portions 201 and the black matrix layer 50. In combination with the above discussion, the constituent material of the black matrix layer 50 may include an organic material such as black resin. Also, a constituent material of the first planarization portions 201 may include organic insulating materials, such as may include, but are not limited to, polyimide, polyamide acid, polyamide, polyvinyl alcohol, polyvinyl alcohol cinnamate, or other suitable photoresist materials. It should be noted that since the constituent material of the first planarization portions 201 and the constituent material of the black matrix layer 50 are both organic materials, the hydrophilicity of both is higher or lower, resulting in greater repulsion between the first planarization portions 201 and the black matrix layer 50. Correspondingly, the adhesive force between the two is smaller.

It can be understood that, in this embodiment, the first passivation layer 60 is disposed on the plurality of first planarization portions 201 and the black matrix layer 50. The adhesive force between the first passivation layer 60 and the black matrix layer 50 is greater than the adhesive force between the first planarization portions 201 and the black matrix layer 50. That is, the first passivation layer 60 can better indirectly fix the black matrix layer 50 on the first planarization portions 201, reducing a risk of separation of the black matrix layer 50. Specifically, the constituent material of the first passivation layer 60 may be an inorganic insulating material, such as, but not limited to, silicon oxide, silicon nitride, and silicon oxynitride. Since the hydrophilicity of inorganic materials is quite different from that of organic materials, it can be considered that a repulsive force between the first passivation layer 60 and one of the first planarization portions 201 and the black matrix layer 50 is smaller, or the adhesive force is larger, to achieve better indirect fixation of the black matrix layer 50 on the first planarization portions 201.

In one embodiment, as shown in FIG. 3, the second planarization portions 202 are provided with via holes 70. The electrode groups 10 are electrically connected to the corresponding driving circuits through the corresponding via holes 70. Specifically, in conjunction with the discussion above, each of the second planarization portions 202 is disposed on a side of the corresponding electrode group 10 close to the driving circuit layer. That is, the electrode group 10 may be disposed opposite to the corresponding second planarization portion 202. Specifically, in this embodiment, the via holes 70 are formed extending through the second planarization portions 202. The via holes 70 can be filled with conductive material to electrically connect the corresponding electrode groups 10 and the corresponding driving circuits. Furthermore, the conductive material filled in the via holes may be the same as the conductive material of the electrode groups 10 to be formed by a same process. In combination with the above discussion, the light-emitting devices 30 are electrically connected to the corresponding electrode groups 10. That is, in this embodiment, the light-emitting devices 30 can be electrically connected to the corresponding driving circuits through the corresponding electrode groups 10, so as to be driven by the corresponding driving circuits to emit light.

In one embodiment, as shown in FIG. 3, each of the via holes 70 includes a first via hole 701 and a second via hole 702 arranged at intervals. Each of the electrode groups 10 includes a first electrode 101 and a second electrode 102. The first electrode 101 is electrically connected to the corresponding driving circuit through the corresponding first via hole 701. The second electrode 102 and the first electrode 101 are disposed in the same layer and spaced apart from each other, and the second electrode 102 is electrically connected to an electrode wiring 80 through the corresponding second via hole 702. A voltage of a portion of the driving circuit electrically connected to the first electrode 101 may not be equal to a voltage of the electrode wiring 80, so that a voltage difference is formed between the first electrode 101 and the second electrode 102, thereby forming a current. In the light-emitting device 30, electrons in an N-type semiconductor and holes in a P-type semiconductor violently collide and recombine in the light-emitting layer to generate photons, which emit energy in the form of photons, that is, it appears as luminescence.

Specifically, the first via hole 701 may be disposed opposite to the first electrode 101. The second via hole 702 may be disposed opposite to the second electrode 102.

Similarly, the first via hole 701 and the second via hole 702 can be filled with conductive substances, so the first electrode 101 is electrically connected to the corresponding driving circuit, and the second electrode 102 is electrically connected to the corresponding electrode wiring 80. Of course, the first electrode 101 can also extend to fill the first via hole 701, and the second electrode 102 can also extend to fill the second via hole 702.

In one embodiment, as shown in FIG. 3, the driving circuits include driving transistors 40. The first electrode 101 is electrically connected to a corresponding drain 401 of the driving transistor 40. The electrode wiring 80 is disposed in the same layer as the drain 401 of the driving transistor 40. In conjunction with the above discussion, the driving transistor 40 may be one of the transistors that is electrically connected to the light-emitting device 30 in the driving circuit. The driving transistor 40 may have a top-gate structure or a bottom-gate structure. Here, the driving transistor 40 is taken as an example of the top-gate structure for description.

Specifically, the display panel 100 may further include at least a substrate 90 for carrying the driving circuit layer. A light shielding layer 11 and a buffer layer 12 may also be provided between the substrate 90 and the driving circuit layer. The light shielding layer 11 may be disposed opposite to the plurality of driving circuits. The buffer layer 12 may be disposed on one side of the light shielding layer 11 and the substrate 90 close to the driving circuit layer. Specifically, the driving transistor 40 may include an active layer 402, a gate insulating layer 403 disposed on a side of the active layer 402 away from the substrate 90, and a gate layer 404 disposed on a side of the gate insulating layer 403 away from the substrate 90. The light shielding layer 11 can be disposed at least opposite to the corresponding active layer 402 and beyond a side of the active layer 402 to ensure that light is blocked from irradiating the active layer 402 to avoid electric leakage problems. An interlayer insulating layer 405 may also be provided on a side of the gate layer 404 away from the substrate 90. The interlayer insulating layer 405 may also extend to cover the active layer 402 and the buffer layer 12. A third via hole 703 and a fourth via hole 704 may be provided on the interlayer insulating layer 405. The third via hole 703 may be disposed opposite to one end of the active layer 402. The fourth via hole 704 may be disposed opposite to the other end of the active layer 402. A source-drain layer may be provided on a side of the interlayer insulating layer 405 away from the substrate 90. The source-drain layer includes a source 406 and a drain 401. The source 406 may be disposed opposite to the third via hole 703 and electrically connected to one end of the active layer 402 through a conductive material filled in the third via hole 703. The drain 401 may be disposed opposite to the fourth via hole 704 and electrically connected to the other end of the active layer 402 through a conductive material filled in the fourth via hole 704.

The substrate 90 can be a rigid substrate or a flexible substrate. The rigid substrate can be, but is not limited to, a glass substrate. The flexible substrate can be made of at least one including but not limited to the same material as a flexible circuit board substrate, the same material as a printed circuit board substrate, and polyimide. The light shielding layer 11 may be a non-light-transmitting film layer. A constituent material of the non-light-transmitting film layer may include, but is not limited to, materials with low reflectivity such as black resin or light-shielding metal. For example, the light-shielding metal can be, but not limited to, Cu and Mo. A constituent material of the buffer layer 12 may include, but is not limited to, silicon nitride and silicon oxide. A constituent material of the active layer 402 may be, but not limited to, amorphous silicon, polysilicon, organic matter, or metal oxide. Both ends of the active layer 402 made of polysilicon can be doped with, but not limited to, phosphorus ions or boron ions, so as to form a source contact region and a drain contact region, respectively. The source contact region is electrically connected to the corresponding source 406, and the drain contact region is electrically connected to the corresponding drain 401. A constituent material of the gate insulating layer 403 and a constituent material of the interlayer insulating layer 405 may include, but are not limited to, inorganic dielectric materials and organic dielectric materials. For example, inorganic dielectric materials may include, but are not limited to, silicon oxide, silicon nitride, and silicon oxynitride. The organic dielectric material can be, but is not limited to, a polymer material such as polyimide-based resin, epoxy-based resin, or acrylic-based resin. A constituent material of the gate layer 404 and a constituent material of the source-drain layer may include, but are not limited to, metals, metal oxides, metal nitrides, and metal oxynitrides. For example, metals may be, but not limited to, Cu, Al, Mo, and Ti.

Furthermore, the source 406 of the driving transistor 40 can also be electrically connected to the light shielding layer 11 through the fifth via hole 705 penetrating the interlayer insulating layer 405 and a portion of the buffer layer 12 to realize electrostatic discharge. It can be considered that the source 406 also extends to be disposed opposite one end of the light shielding layer 11. In combination with the above discussion, the electrode wiring 80 and the drain 401 of the driving transistor 40 are arranged in the same layer. Furthermore, the electrode wiring 80 may be disposed on a side of the corresponding drain 401 away from the corresponding active layer 402, so that the light-emitting device 30 is electrically connected to the corresponding drain 401 and the corresponding electrode wiring 80. A constituent material of the electrode wiring 80 may be the same as that of the source-drain layer. Furthermore, the display panel 100 may further include a second passivation layer 13 covering the source-drain layer, the electrode wiring 80, and the interlayer insulating layer 405. A constituent material of the second passivation layer 13 may be the same as that of the first passivation layer 60.

In one embodiment, as shown in FIG. 3, each of the electrode groups 10 includes a first sub-electrode portion 103 and a second sub-electrode portion 104. The first sub-electrode portion 103 is electrically connected to the corresponding driving circuit through the corresponding via hole 70. A constituent material of the first sub-electrode portion 103 includes metal. The second sub-electrode portion 104 is disposed on a side of the first sub-electrode portion 103 away from the driving circuit, and is electrically connected between the first sub-electrode portion 103 and the corresponding light-emitting device 30. A constituent material of the second sub-electrode portion 104 includes metal oxide. Specifically, in this embodiment, the first sub-electrode portion 103 may be made of, but not limited to, metal, and the second sub-electrode portion 104 may be made of, but not limited to, metal oxide. Metals may include, but are not limited to, copper, aluminum, and metal oxides may be, but not limited to, indium tin oxide. It can be understood that the first sub-electrode portion 103 made of metal has a lower resistivity, that is, a higher conductivity. The second sub-electrode portion 104 made of metal oxide has greater oxidation resistance. While having conductivity, a risk of the first sub-electrode portion 103 being oxidized and failing can also be reduced, and the reliability of the operation of the electrode group 10 can be improved.

In one embodiment, as shown in FIG. 3, the light-emitting devices 30 are micro light-emitting diodes or mini light-emitting diodes. Understandably, both the micro light-emitting diodes and the mini light-emitting diodes can be fixed on the electrode groups 10 by means of transfer. That is, the present disclosure can improve but not limited to the problem of low reliability of the micro light-emitting diodes and the mini light-emitting diodes when transferred to the electrode groups 10. Specifically, light-emitting colors of the plurality of light-emitting devices 30 may be the same or different. If the same, it can be blue, and can be used in conjunction with a color conversion layer including, but not limited to, doping phosphors in glue, QD quantum dots, and organic dyes to achieve color display. If different, light-emitting colors of two adjacent light-emitting devices 30 may be different.

The light-emitting device 30 may include a first light-emitting electrode 301, a second light-emitting electrode 302, and a light-emitting body 303. The first light-emitting electrode 301 and the second light-emitting electrode 302 are disposed opposite to each other. The light-emitting body 303 is disposed between the two. The first light-emitting electrode 301 can be arranged in contact with the first electrode 101 for electrical connection. The second light-emitting electrode 302 can be arranged in contact with the second electrode 102 for electrical connection. In conjunction with the above discussion, a voltage difference is formed between the first electrode 101 and the second electrode 102, so that a voltage difference is also formed between the first light-emitting electrode 301 and the second light-emitting electrode 302 to form a current flowing through the light-emitting device 30. In the light-emitting device 30, the electrons in the N-type semiconductor and the holes in the P-type semiconductor violently collide and recombine in the light-emitting layer to generate photons, which emit energy in the form of photons, that is, it appears as luminescence. Furthermore, the display panel 100 may further include an encapsulation adhesive layer disposed on a side of the plurality of light-emitting devices 30, the black matrix layer 50, and the planarization layer 20 away from the driving circuit layer. The encapsulating adhesive layer may be transparent, and the encapsulating adhesive layer may be formed by, but not limited to, transparent adhesive.

The present disclosure provides an electronic terminal including the display panel 100 as described in any of the above. Furthermore, the light-emitting devices 30 in the display panel 100 can be used as sub-pixels for display images, and can also be used as a backlight source to pass through liquid crystal molecules for display images.

Figure 4:
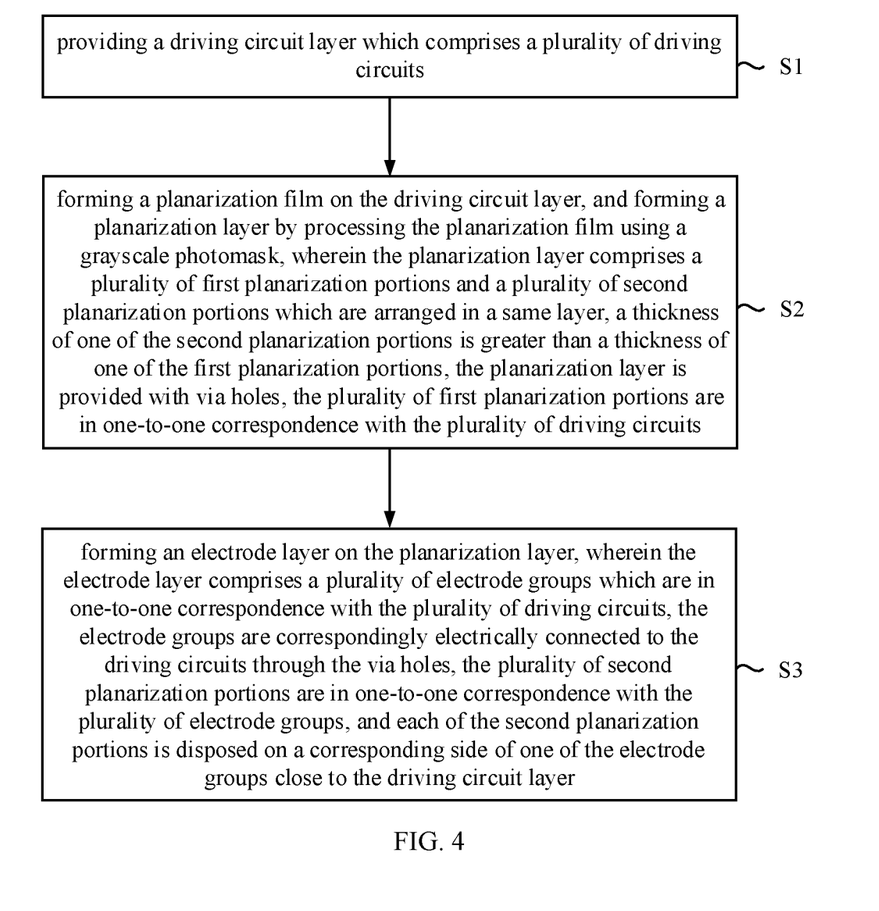
FIG. 4 is a flowchart of a manufacturing method of a display panel of an embodiment of the present disclosure.

The present disclosure provides a manufacturing method of a display panel. As shown in FIG. 4, the manufacturing method of the display panel includes but is not limited to the following steps and a combination of the following steps.

S1, a driving circuit layer is provided. The driving circuit layer includes a plurality of driving circuits.

Figure 5:
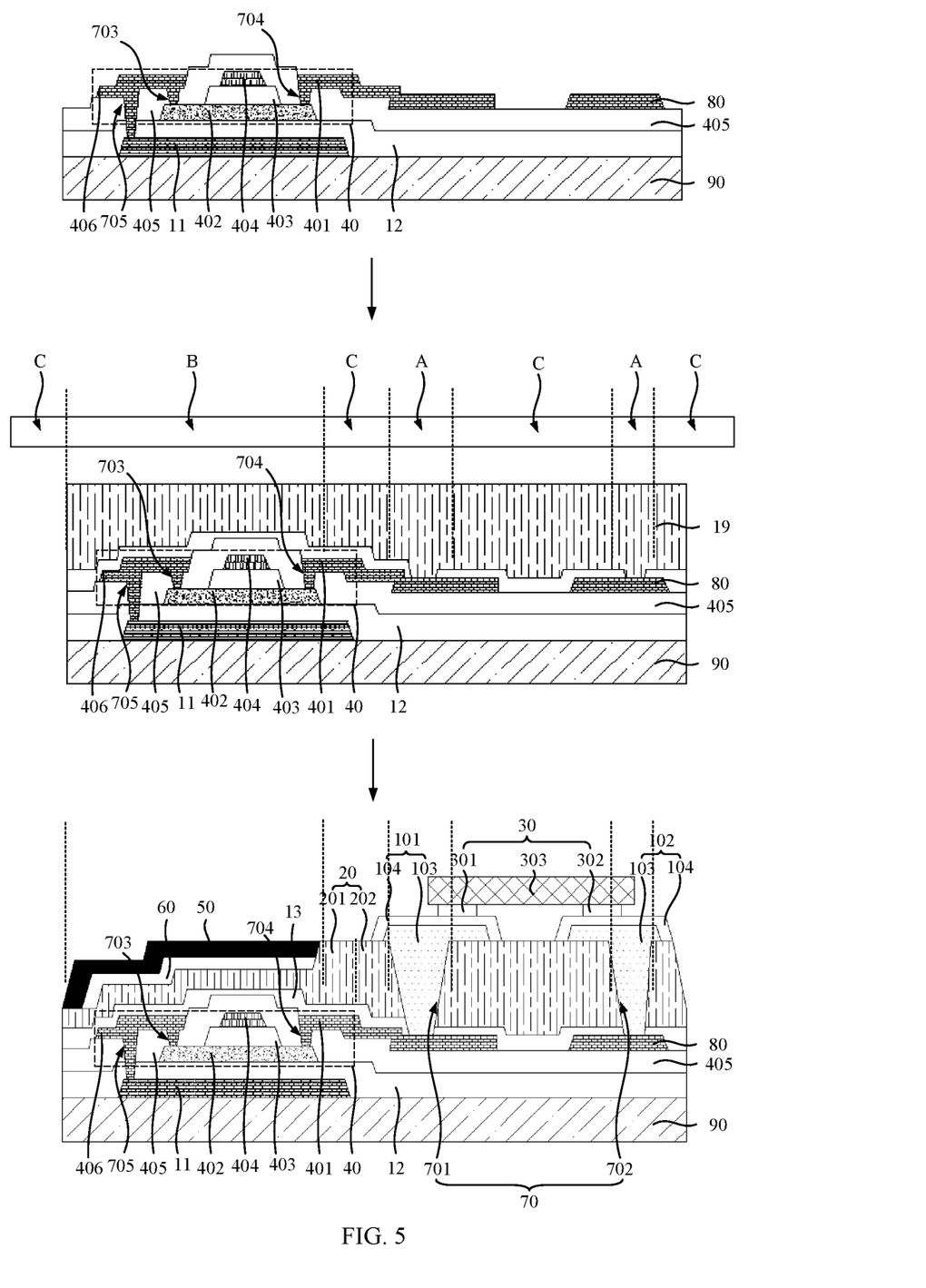
FIG. 5 is a schematic diagram of a production scene of a display panel of an embodiment of the present disclosure.

Specifically, as shown in FIG. 5, the plurality of driving circuits may be arranged in an array, but not limited to. The driving circuits may include a plurality of transistors that are electrically connected. The plurality of transistors may include driving transistors 40. The driving circuit layer may further include a plurality of gate lines and a plurality of data lines arranged to intersect with the plurality of gate lines. It should be noted that, in the driving circuit layer, the driving circuits may include a plurality of metal layers and an insulating layer. The metal layers are stacked and spaced apart from each other. The insulating layer is provided between two adjacent metal layers. Thus, the driving circuits have a larger thickness than other areas in the driving circuit layer, causing a top of the driving circuit to be higher than tops of other areas in the driving circuit layer.

With reference to FIG. 5, an electrode wiring 80 provided in the same layer as the source-drain layer may also be included. The step S1 may include that a substrate 90 is provided. A light shielding layer 11 and a buffer layer 12 are formed on the substrate 90. The light shielding layer 11 can be arranged opposite to the plurality of driving circuits. The buffer layer 12 can be disposed on a side of the light shielding layer 11 and the substrate 90 close to the driving circuit layer. The light shielding layer 11 may be disposed opposite to at least the plurality of driving transistors 40. Specifically, for the features of the related structures in this embodiment, reference may be made to the above related descriptions about the electrode wiring 80, the substrate 90, the light shielding layer 11, and the buffer layer 12.

As shown in FIG. 5, the driving transistor 40 may include an active layer 402, a gate insulating layer 403 disposed on a side of the active layer 402 away from the substrate 90, and a gate layer 404 disposed on a side of the gate insulating layer 403 away from the substrate 90. The light shielding layer 11 can be disposed at least opposite to the corresponding active layer 402 and beyond a side of the active layer 402 to ensure that light is blocked from irradiating the active layer 402 to avoid electric leakage problems. An interlayer insulating layer 405 may also be provided on a side of the gate layer 404 away from the substrate 90. The interlayer insulating layer 405 may also extend to cover the active layer 402 and the buffer layer 12. A third via hole 703 and a fourth via hole 704 may be provided on the interlayer insulating layer 405. The third via hole 703 may be disposed opposite to one end of the active layer 402. The fourth via hole 704 may be disposed opposite to the other end of the active layer 402. A source-drain layer may be provided on a side of the interlayer insulating layer 405 away from the substrate 90. The source-drain layer includes a source 406 and a drain 401. The source 406 may be disposed opposite to the third via hole 703 and electrically connected to one end of the active layer 402 through a conductive material filled in the third via hole 703. The drain 401 may be disposed opposite to the fourth via hole 704 and electrically connected to the other end of the active layer 402 through a conductive material filled in the fourth via hole 704.

S2, a planarization film is formed on the driving circuit layer, and a planarization layer is formed by processing the planarization film using a grayscale photomask. The planarization layer includes a plurality of first planarization portions and a plurality of second planarization portions which are arranged in a same layer, a thickness of one of the second planarization portions is greater than a thickness of one of the first planarization portions, the planarization layer is provided with via holes, the plurality of first planarization portions are in one-to-one correspondence with the plurality of driving circuits.

Before the step S2, as shown in FIG. 5, a second passivation layer 13 may be formed on the driving circuit layer. The second passivation layer 13 may cover the source-drain layer, the electrode wiring 80, and the interlayer insulating layer 405. A constituent material of the second passivation layer 13 may be an inorganic insulating material, such as, but not limited to, silicon oxide, silicon nitride, and silicon oxynitride.

A constituent material of the planarization film 19 for forming the planarization layer 20 may include an organic insulating material, for example, may include, but is not limited to, polyimide, polyamide acid, polyamide, polyvinyl alcohol, polyvinyl alcohol cinnamate, or other suitable photoresist materials. Specifically, as shown in FIG. 5, in the step S2, the grayscale photomask 18 may be set opposite to the planarization film. Based on this, the grayscale photomask 18 may include a first area A, a second area B, and a third area C whose light transmittances decrease sequentially. For example, the first area A may be a fully transparent area, the second area B may be a partially transparent area, and the third area C may be an opaque area. According to a yellow light process, three areas in the planarization film corresponding to the first area A, the second area B, and the third area C can be respectively formed as via holes 70, first planarization portions 201, and second planarization portions 202 to form the planarization layer 20. It should be noted that, a portion of the second passivation layer 13 corresponding to the via hole 70 may also be formed with a corresponding via hole. Specifically, for the features of the related structures in this embodiment, reference may be made to the above related descriptions about the via holes 70, the first planarization portions 201, and the second planarization portions 202.

It can be understood that, in combination with the above discussion, the top of the driving circuits is higher than the top of other areas in the driving circuit layer, which can be understood as the top of the driving transistor 40 is higher than the top of other areas in the driving circuit layer. The thickness of the second planarization portion 202 in this embodiment is greater than the thickness of the first planarization portion 201, such that the distance between the top of the first planarization portion 201 and the top of the second planarization portion 202 is smaller than the distance between the top of the driving transistor 40 and the top of other regions in the driving circuit layer, and the distance is reduced.

S3, an electrode layer is formed on the planarization layer. The electrode layer includes a plurality of electrode groups which are in one-to-one correspondence with the plurality of driving circuits, the electrode groups are correspondingly electrically connected to the driving circuits through the via holes, the plurality of second planarization portions are in one-to-one correspondence with the plurality of electrode groups, and each of the second planarization portions is disposed on a corresponding side of one of the electrode groups close to the driving circuit layer.

Specifically, as shown in FIG. 5, in conjunction with the above discussion, "the plurality of first planarization portions 201 are in one-to-one correspondence with the plurality of driving circuit" and "the electrode layer is formed on the planarization layer" mean that each of the first planarization portions 201 is disposed on a side of the corresponding driving circuit close to the electrode layer. Also, "each of the second planarization portions 202 is disposed on one side of the corresponding electrode group 10 close to the driving circuit layer" means that the planarization layer 20 including the first planarization portions 201 and the second planarization portions 202 disposed in the same layer is located between the driving circuit layer and the electrode layer. The first planarization portions 201 are arranged opposite to the corresponding driving circuits, and the second planarization portions 202 are arranged opposite to the corresponding electrode groups 10, that is, it can be considered that the driving circuits and the electrode groups 10 are also arranged at intervals in a horizontal direction.

It can be understood that in this embodiment, the electrode groups 10 are disposed on the side of the second planarization portions 202 away from the driving circuit layer, and the thickness of the second planarization portion 202 is greater than the thickness of the first planarization portion 201. That is, the second planarization portions 202 with a larger thickness and the first planarization portions 201 with a smaller thickness can reduce the distance between the tops of the electrode groups 10 and the tops of the first planarization portions 201 in the vertical direction. Thus, the tops of the electrode groups 10 are prevented from being much lower than the tops of the first planarization portions 201.

S4, a light-emitting layer is formed on the electrode layer. The light-emitting layer includes a plurality of light-emitting devices which are in one-to-one correspondence with the plurality of electrode groups, and the light-emitting devices are correspondingly electrically connected to the electrode groups.

Specifically, as shown in FIG. 5, in conjunction with the above discussion, the light-emitting device 30 and the corresponding electrode group 10 are sequentially stacked on a corresponding second planarization portion 202. It can be understood that in this embodiment, the thickness of the second planarization portion 202 is greater than the thickness of the first planarization portion 201, it is avoided that the electrode group 10 forms a distinct "concave" shape between two adjacent first planarization portions 201. A reduction in the distance between the top of the electrode group 10 for carrying the light-emitting device 30 and the top of the first planarization portion 201 can be achieved. The risk that the top of the first planarization portion 201 is too high to block the light-emitting device 30 from contacting the electrode group 10 can be reduced. The difficulty of fixing the light-emitting devices 30 to electrode groups 10 is reduced, the reliability of light-emitting devices 30 being fixed to electrode groups 10 is improved, and the quality of display images is improved.

Before the step S4, as shown in FIG. 5, conductive substances may be filled in the first via hole 701 and the second via hole 702 arranged at intervals, the first electrode 101 and the second electrode 102 are formed on the second planarization portion 202 to constitute the electrode group 10 in step S3. The first electrode 101 is electrically connected to the driving transistor 40 through the conductive material in the first via hole 701. The second electrode 102 is electrically connected to the driving transistor 40 through the conductive material in the second via hole 702. Of course, the constituent material of the conductive substance filled in the via hole 70 can be the same as the constituent material of the electrode groups 10, so that the conductive substance filled in the via hole 70 and the electrode groups 10 can be simultaneously formed by the same material and the same process.

After the step S4, as shown in FIG. 5, a first passivation layer 60 and a black matrix layer may be sequentially formed on the first planarization portions 101. Specifically, for the features of the related structures in this embodiment, reference may be made to the above related descriptions about the electrode groups 10, the first passivation layer 60, and the black matrix layer 50.

The present disclosure provides the display panel and the manufacturing method thereof, and the electronic terminal, including the driving circuit layer, the electrode layer, the planarization layer, and the light-emitting layer. The driving circuit layer includes the plurality of driving circuits. The electrode layer is disposed on the driving circuit layer and includes the plurality of electrode groups which are in one-to-one correspondence with the plurality of driving circuits. The electrode groups are correspondingly electrically connected to the driving circuits. The planarization layer is disposed between the driving circuit layer and the electrode layer, and includes the plurality of first planarization portions and the plurality of second planarization portions which are arranged on the same layer. The plurality of first planarization portions are in one-to-one correspondence with the plurality of driving circuits, the plurality of second planarization portions are in one-to-one correspondence with the plurality of electrode groups, each of the first planarization portions is disposed on the corresponding side of one of the driving circuits close to the electrode layer, and each of the second planarization portions is disposed on the corresponding side of one of the electrode groups close to the driving circuit layer. The light-emitting layer is disposed on the side of the electrode layer away from the driving circuit layer, and includes the plurality of light-emitting devices which are in one-to-one correspondence with the plurality of electrode groups. The light-emitting devices are correspondingly electrically connected to the electrode groups. The thickness of one of the second planarization portions is greater than the thickness of one of the first planarization portions. The difference between the distance between the top of the electrode group and the substrate and the distance between the top of the first planarization portion and the substrate in the vertical direction is reduced, so as to reduce the risk that the top of the first planarization portion is too high and prevent the light-emitting device from contacting the electrode group, thereby improving the reliability of the light-emitting device being fixed to the electrode group, and improving the quality of display images.

The display panel and the manufacturing method thereof, and the electronic terminal provided by the embodiments of the present disclosure have been introduced in detail above. The principles and implementations of the present disclosure are explained with specific examples in this specification. The descriptions of the above embodiments are only used to help understand the technical solutions and core ideas of the present disclosure. Those of ordinary skill in the art should understand that they can still make modifications to the technical solutions described in the foregoing embodiments, or perform equivalent replacements to some of the technical features. These modifications or replacements do not make the essence of the corresponding technical solutions deviate from the scope of the technical solutions of the various embodiments of the present disclosure.

What is claimed is:

1. A display panel, comprising:
    a driving circuit layer comprising a plurality of driving circuits;
    an electrode layer disposed on the driving circuit layer and comprising a plurality of electrode groups which are in one-to-one correspondence with the plurality of driving circuits, wherein the electrode groups are correspondingly electrically connected to the driving circuits;
    a planarization layer disposed between the driving circuit layer and the electrode layer, and comprising a plurality of first planarization portions and a plurality of second planarization portions which are arranged on a same layer, wherein the plurality of first planarization portions are in one-to-one correspondence with the plurality of driving circuits, the plurality of second planarization portions are in one-to-one correspondence with the plurality of electrode groups, each of the first planarization portions is disposed on a corresponding side of one of the driving circuits close to the electrode layer, and each of the second planarization portions is disposed on a corresponding side of one of the electrode groups close to the driving circuit layer; and
    a light-emitting layer disposed on a side of the electrode layer away from the driving circuit layer, and comprising a plurality of light-emitting devices which are in one-to-one correspondence with the plurality of electrode groups, wherein the light-emitting devices are correspondingly electrically connected to the electrode groups; and
    wherein a thickness of one of the second planarization portions is greater than a thickness of one of the first planarization portions.

2. The display panel according to claim 1, further comprising:
    a substrate disposed on a side of the driving circuit layer away from the electrode layer; and
    a black matrix layer disposed on a side of the plurality of first planarization portions away from the driving circuit layer, wherein a difference between a distance between a top of the black matrix layer and the substrate and a distance between a top of the electrode layer and the substrate is less than or equal to a thickness of one of the light-emitting devices.

3. The display panel according to claim 2, wherein the difference between the distance between the top of the black matrix layer and the substrate and the distance between the top of the electrode layer and the substrate is less than or equal to 0.

4. The display panel according to claim 2, further comprising a first passivation layer disposed between the plurality of first planarization portions and the black matrix layer, wherein an adhesive force between the first passivation layer and the black matrix layer is greater than an adhesive force between the first planarization portions and the black matrix layer.

5. The display panel according to claim 1, wherein the second planarization portions are provided with via holes, and the electrode groups are correspondingly electrically connected to the driving circuits through the via holes.

6. The display panel according to claim 5, wherein each of the electrode groups comprises:
    a first sub-electrode portion correspondingly electrically connected to one of the driving circuits through the via hole, wherein a constituent material of the first sub-electrode portion comprises metal; and
    a second sub-electrode portion disposed on a side of the first sub-electrode portion away from the driving circuits, and correspondingly electrically connected between the first sub-electrode portion and the light-emitting device, wherein a constituent material of the second sub-electrode portion comprises metal oxides.

7. The display panel according to claim 5, wherein each of the via holes comprises a first via hole and a second via hole which are arranged at intervals, and each of the electrode groups comprises:
    a first electrode correspondingly electrically connected to the driving circuit through the first via hole; and
    a second electrode, wherein the second electrode and the first electrode are arranged on a same layer and spaced apart from each other, and the second electrode is electrically connected to an electrode wiring through the second via hole.

8. The display panel according to claim 7, wherein each of the driving circuits comprises a driving transistor, the first electrode is electrically connected to a drain of the driving transistor, and the electrode wiring and the drain of the driving transistor are arranged in a same layer.

9. The display panel according to claim 1, wherein the light-emitting devices are micro light-emitting diodes or mini light-emitting diodes.

10. An electronic terminal, comprising the display panel according to claim 1.

11. The electronic terminal according to claim 10, further comprising:
a substrate disposed on a side of the driving circuit layer away from the electrode layer; and
a black matrix layer disposed on a side of the plurality of first planarization portions away from the driving circuit layer, wherein a difference between a distance between a top of the black matrix layer and the substrate and a distance between a top of the electrode layer and the substrate is less than or equal to a thickness of one of the light-emitting devices.

12. The electronic terminal according to claim 11, wherein the difference between the distance between the top of the black matrix layer and the substrate and the distance between the top of the electrode layer and the substrate is less than or equal to 0.

13. The electronic terminal according to claim 11, further comprising a first passivation layer disposed between the plurality of first planarization portions and the black matrix layer, wherein an adhesive force between the first passivation layer and the black matrix layer is greater than an adhesive force between the first planarization portions and the black matrix layer.

14. The electronic terminal according to claim 10, wherein the second planarization portions are provided with via holes, and the electrode groups are correspondingly electrically connected to the driving circuits through the via holes.

15. The electronic terminal according to claim 14, wherein each of the electrode groups comprises:
a first sub-electrode portion correspondingly electrically connected to one of the driving circuits through the via hole, wherein a constituent material of the first sub-electrode portion comprises metal; and
a second sub-electrode portion disposed on a side of the first sub-electrode portion away from the driving circuits, and correspondingly electrically connected between the first sub-electrode portion and the light-emitting device, wherein a constituent material of the second sub-electrode portion comprises metal oxides.

16. The electronic terminal according to claim 14, wherein each of the via holes comprises a first via hole and a second via hole which are arranged at intervals, and each of the electrode groups comprises:
a first electrode correspondingly electrically connected to the driving circuit through the first via hole; and
a second electrode, wherein the second electrode and the first electrode are arranged on a same layer and spaced apart from each other, and the second electrode is electrically connected to an electrode wiring through the second via hole.

17. The electronic terminal according to claim 16, wherein each of the driving circuits comprises a driving transistor, the first electrode is electrically connected to a drain of the driving transistor, and the electrode wiring and the drain of the driving transistor are arranged in a same layer.

18. The electronic terminal according to claim 10, wherein the light-emitting devices are micro light-emitting diodes or mini light-emitting diodes.

19. A manufacturing method of a display panel, comprising:
providing a driving circuit layer which comprises a plurality of driving circuits;
forming a planarization film on the driving circuit layer, and forming a planarization layer by processing the planarization film using a grayscale photomask, wherein the planarization layer comprises a plurality of first planarization portions and a plurality of second planarization portions which are arranged in a same layer, a thickness of one of the second planarization portions is greater than a thickness of one of the first planarization portions, the planarization layer is provided with via holes, the plurality of first planarization portions are in one-to-one correspondence with the plurality of driving circuits, each of the first planarization portions is disposed on a corresponding side of one of the driving circuits close to the electrode layer;
forming an electrode layer on the planarization layer, wherein the electrode layer comprises a plurality of electrode groups which are in one-to-one correspondence with the plurality of driving circuits, the electrode groups are correspondingly electrically connected to the driving circuits through the via holes, the plurality of second planarization portions are in one-to-one correspondence with the plurality of electrode groups, and each of the second planarization portions is disposed on a corresponding side of one of the electrode groups close to the driving circuit layer; and
forming a light-emitting layer on the electrode layer, wherein the light-emitting layer comprises a plurality of light-emitting devices which are in one-to-one correspondence with the plurality of electrode groups, and the light-emitting devices are correspondingly electrically connected to the electrode groups.

20. The manufacturing method of the display panel according to claim 19, wherein the grayscale photomask comprises a first area, a second area, and a third area, and light transmittances of the first area, the second area, and the third area are sequentially decreased;
wherein the step of forming the planarization layer by processing the planarization film using the grayscale photomask comprises:
arranging the grayscale photomask relative to the planarization film;
forming the via holes by processing a corresponding portion of the planarization film using the first area of the grayscale photomask, forming the first planarization portions by processing a corresponding portion of the planarization film using the second area of the grayscale photomask, and forming the second planarization portions by processing a corresponding portion of the planarization film using the third area of the grayscale photomask.

* * * * *